United States Patent [19]

Pasch et al.

[11] Patent Number: 5,168,346

[45] Date of Patent: Dec. 1, 1992

[54] METHOD AND APPARATUS FOR ISOLATION OF FLUX MATERIALS IN FLIP-CHIP MANUFACTURING

[75] Inventors: Nicholas F. Pasch, Redwood City; Vahak K. Sahakian, Los Altos Hills; Conrad J. Dell'Oca, Palo Alto, all of Calif.

[73] Assignee: LSI Logic Corporation, Milpitas, Calif.

[21] Appl. No.: 775,009

[22] Filed: Oct. 11, 1991

Related U.S. Application Data

[60] Division of Ser. No. 576,182, Aug. 30, 1990, Pat. No. 5,111,279, which is a continuation of Ser. No. 400,572, Aug. 28, 1989, abandoned.

[51] Int. Cl.$^5$ .................... H01L 39/02; H01L 23/02; H01L 23/12
[52] U.S. Cl. ..................................... 257/738; 257/778
[58] Field of Search ................. 357/80, 81, 74, 65; 174/52.1

[56] References Cited

U.S. PATENT DOCUMENTS

| | | | |
|---|---|---|---|
| 3,429,040 | 2/1969 | Miller | 357/80 |
| 3,811,186 | 5/1974 | Lanerd et al. | 29/626 |
| 3,871,014 | 3/1975 | King et al. | 357/67 |
| 4,190,855 | 2/1980 | Inoue | 357/80 |
| 4,355,463 | 10/1982 | Burns | 29/827 |
| 4,545,610 | 10/1985 | Lakritz et al. | 29/589 |
| 4,825,284 | 4/1989 | Soga et al. | 357/80 |
| 4,926,241 | 5/1990 | Carey | 357/75 |
| 4,970,575 | 11/1990 | Soga et al. | 357/72 |
| 4,970,577 | 11/1990 | Ogihara et al. | 357/74 |

FOREIGN PATENT DOCUMENTS

| | | | |
|---|---|---|---|
| 57-10638 | 12/1982 | Japan | 437/214 |
| 60-049638 | 3/1985 | Japan | 437/209 |
| 61-142750 | 6/1986 | Japan | 437/209 |
| 61-145838 | 6/1986 | Japan | 437/209 |
| 63-239827 | 10/1988 | Japan | 357/81 |
| 63-268418 | 11/1988 | Japan | 174/52.1 |

Primary Examiner—Jerome Jackson, Jr.
Assistant Examiner—D. Monin
Attorney, Agent, or Firm—Michael D. Rostoker; Gerald E. Linden

[57] ABSTRACT

A preformed planar structure is interposed between the chip(s) and the substrate in a flip-chip structure, and establishes a minimum gap between the chip(s) and the substrate. Liquid flux may be applied to the preformed planar structure in order that flux is selectively applied to the solder balls (pads) on the chip and the substrate. The preformed planar structure may be provided with through holes in registration with the solder balls on the chip(s) and the substrate. In this case, liquid flux selectively fills the through holes for delivery to the solder balls during soldering. The through holes also aid in maintaining registration of the chip(s) and the substrate. The through holes may be sized to establish a predetermined mechanical structure of solder joints formed by the solder balls when fused together. The preformed planar structure has a planar core and opposing planar faces. The core is formed of thermosetting organic resin, such as polyimide, or non-organic material such as alumina, polished sapphire, beryllium oxide, aluminum nitride or aluminum. The planar faces of the preformed planar structure are formed of thermoplastic resin or thermosetting material, such as polyacetal, expoxide resin or polystyrene. The preformed planar structure tends to draw the chip(s) together to the substrate, establishing a flip-chip structure of mechanical integrity. The preformed planar structure has a thickness of 5-50 microns, preferably on the order of 20-30 microns. Method and apparatus are disclosed.

20 Claims, 2 Drawing Sheets

METHOD AND APPARATUS FOR ISOLATION OF FLUX MATERIALS IN FLIP-CHIP MANUFACTURING

CROSS REFERENCE TO RELATED APPLICATIONS

This is a division of copending U.S. patent application Ser. No. 576,182 filed Aug. 30, 1990, now U.S. Pat. No. 5,111,279, which is a continuation of Ser. No. 400,572 filed Aug. 28, 1989, now abandoned.

TECHNICAL FIELD OF THE INVENTION

The invention relates to semiconductor "flip-chip" manufacturing techniques and, more particularly, to the fluxing and soldering steps employed in flip-chip manufacture.

As used herein, the term "substrate" refers to a semiconductor (silicon) chip to which one or more semiconductor chips are soldered in face-to-face relationship. The resulting assembly is termed a flip-chip structure.

BACKGROUND OF THE INVENTION

"Flip-chip" manufacturing techniques involve soldering one or more semiconductor (silicon) chips (one is discussed), in face-to-face relationship, to another semiconductor chip termed a "substrate". Typically, solder balls (otherwise known as pads or bumps) are formed (raised above the planar surface of the chip and substrate) on facing surfaces of both the chip and the substrate at intended points of contact between the two, liquid flux (rosin) is often applied to the face of the chip and/or substrate, the chip is mechanically held in register with the substrate, and the chip and the substrate are subjected to elevated temperature to effect soldering, or fusion of the solder balls on the chip and the corresponding solder balls on the substrate.

The "solder balls" on either the chip or substrate, typically those on the substrate, may be solderable metallized surfaces. The soldering process may be carried out in a reducing atmosphere. A typical flip-chip structure is shown in FIG. 1, and is discussed in greater detail hereinafter.

Previous systems of rigid attachment of chips to chucks have been used for chip alignment, but they must allow some degree of compliance because the chips tend to change relative alignment during soldering by surface tension between the solder balls. The addition of liquid flux to the chip/substrate (flip-chip) assembly creates capillary attraction between the chip and the substrate, which serves to misalign the chip with respect to the substrate. This is illustrated in FIG. 2, and is discussed in greater detail hereinafter. Further, much of the flux that is applied to the flip-chip assembly is wasted. Still further, the dimension of the remaining gap between the chip and the substrate and the mechanical properties of the solder joints formed by the solder balls and corresponding solder balls tends to be indeterminate.

DISCLOSURE OF THE INVENTION

It is therefore an object of the invention to provide a flip-chip manufacturing technique which reduces capillary action, and hence misalignment, between a chip and a substrate.

It is a further object of the invention to provide a flip-chip manufacturing technique which requires the use of less flux, and which controls the position of the flux between the chip and the substrate.

It is a further object of the invention to provide a flip-chip manufacturing technique which provides a controlled spacing between chips and the substrate.

It is a further object of the invention to provide a flip-chip manufacturing technique which provides solder joints having predictable and tailorable mechanical characteristics.

It is a further object of the invention to provide a flip-chip manufacturing technique that simplifies the face-to-face joining of the chip and substrate.

According to the invention, a preformed planar structure is interposed between the chip(s) and the substrate in a flip-chip structure. The preformed planar structure establishes a minimum gap between the chip(s) and the substrate.

According to a feature of the invention, liquid flux is applied to the preformed planar structure in order that flux is selectively applied to the solder balls (pads) on the chip and the substrate.

In an embodiment of the invention, the preformed planar structure is provided with through holes in registration with the solder balls (pads) on the chip(s) and the substrate. In this embodiment, liquid flux selectively fills the through holes for delivery to the solder balls during soldering. The through holes also aid in maintaining registration of the chip(s) and the substrate.

According to an aspect of the invention, the through holes are sized to establish a predetermined mechanical structure of solder joints formed by the solder balls when fused together.

According to an aspect of the invention, the preformed planar structure has a planar core and opposing planar faces. The core is formed of thermosetting organic resin, such as polyimide, or non-organic material such as alumina, polished sapphire, beryllium oxide, aluminum or aluminum nitride. The planar faces of the preformed planar structure are formed of thermoplastic resin or thermosetting material, such as polyacetal, epoxy (epoxide resins) or polystyrene. The preformed planar structure tends to draw the chip(s) together to the substrate, establishing a flip-chip structure of mechanical integrity.

According to an aspect of the invention, the preformed planar structure has a thickness of 5–50 microns, preferably on the order of 20–30 microns.

Other objects, features and advantages of the invention will become apparent in light of the following description thereof.

DETAILED DESCRIPTION OF THE INVENTION

Figure 1:
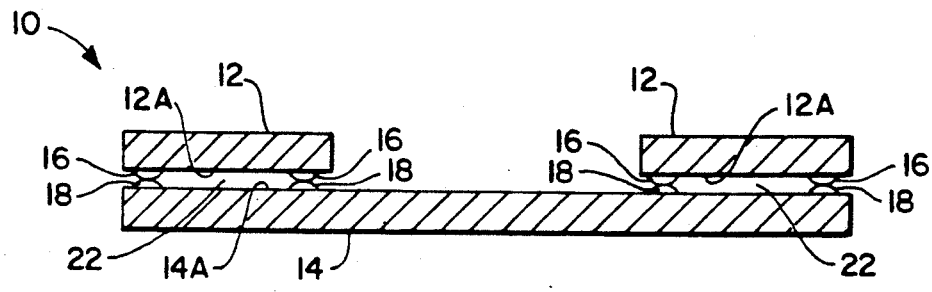
FIG. 1 is a cross-sectional view of a typical, prior art flip-chip structure.
Figure 2:
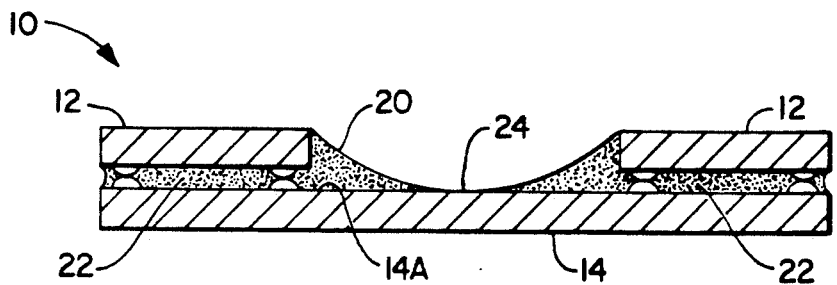
FIG. 2 is a cross-sectional view of a prior art flip-chip assembly illustrating capillary action caused by liquid flux, resulting in the misalignment of a chip with respect to a substrate.

FIGS. 1 and 2 illustrate the prior art technique of assembling flip-chips 10. The completed flip-chip structure 10 includes one or more silicon chips 12 (two of such chips are illustrated) mounted in face-to-face relationship to a larger silicon chip or substrate 14 in the following manner. Solder balls (pads) 16 are formed on the face 12A of the chip 12, and solder balls (pads) 18 are formed on the face 14A of the substrate 14 in corresponding positions. It should be understood that the solder balls on either of the chip 12 or substrate 14, typically the corresponding solder balls 18 on the substrate 14, may be solderable metallized surfaces.

Liquid flux 20 (shown in FIG. 2 only) is applied to the face 14A of the substrate 14, prior to bringing the chips 12 in face-to-face relationship with the substrate 14. The chips 12 are placed in face-to-face relationship by mechanical means, such as with a chuck (not illustrated) and the temperature of the chips and substrate is elevated sufficiently to cause the solder balls 16 on the face 12A of the chips 12 to "fuse", forming solder joints, with the corresponding solder balls 18 on the face 14A of the substrate.

As illustrated in FIG. 2, the liquid flux 20 fills a gap 22 between the faces 12A of the chip 12 and the face 14A of the substrate 14, and also fills an area on the face 14A of the substrate 14 between the chips 12. Capillary action and/or surface tension created by the presence of the liquid flux 20 causes the chips 12 to migrate to the center 24 of the substrate 14 during the soldering process, resulting in a lack of registration between the chips 12 and the substrate 14, and hence between the solder balls 16 and the corresponding solder balls 18, respectively. This tendency of the chips to become misaligned during soldering is augmented by any initial lack of planarity between the chip 12 and the substrate 14, and is extremely disadvantageous in the assembly of flip-chips. For instance, it becomes extremely difficult to characterize the mechanical configuration of the solder joints not only because of the difficulty in maintaining accurate registration, but also because of the somewhat unpredictable dimension of the gap 22 between the chips and the substrate. This can adversely affect flip-chip throughput in the manufacturing process. Further, as is evident from FIG. 2, much more flux is used than is required to effect clean solder joints between the solder balls 16 and corresponding solder balls 18, respectively.

Figure 3:
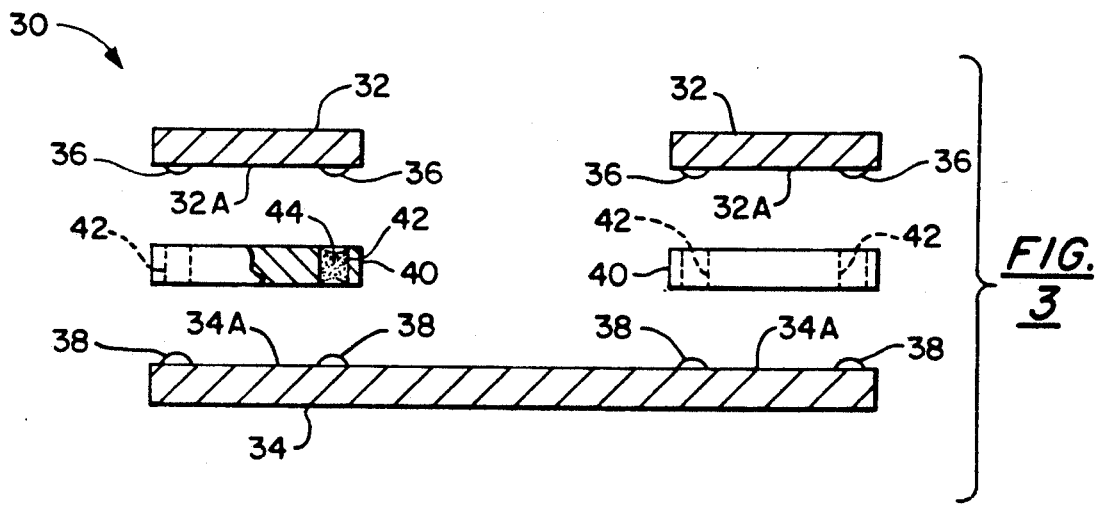
FIG. 3 is an exploded cross-sectional view of a flip-chip assembly, prior to soldering, according to the technique of the present invention.

FIG. 3 illustrates the present, inventive technique of assembling flip-chips 30. In a manner similar to that previously discussed, the flip-chip assembly 30 includes one or more silicon chips 32 (two of such chips are illustrated) ultimately mounted in face-to-face relationship to a large silicon chip or substrate 14 in the following manner. Solder balls 36 are formed on the face 32A of the chip 32, and solder balls 38 are formed on the face 34A of the substrate 34 in corresponding positions. Notably, liquid flux is not applied to the face 34A of the substrate 34, prior to soldering the chip 32 thereto. Nor is liquid flux required to be applied to the faces 32A of the chips 32.

Prior to soldering the chips 32 to the substrate 34, a performed planar structure 40 (otherwise termed a "stamp" or "plastic standoff element", and discussed in greater detail hereinafter), of similar planar dimension as the chip 32, is interposed between the chips 32 and the substrate 34. The planar structure 40 is provided with through holes 42 in positions corresponding to the positions of the solder balls 26 and 38, respectively. Inasmuch as the solder balls 36 are typically located just within the perimeter of the chips 32, the through holes 42 would be located just within the perimeter of the planar structure 40.

Prior to soldering, the planar structure 40 is dipped (not illustrated) into a solution (bath) of liquid flux, such as rosin material, and is allowed to dry, as shown at 44. In this manner, the planar structure 40 receives selectively deposited rosin preferentially within the holes 42, in registration with the corresponding solder balls 32 and 34, and there will be be very little, if any, flux on the planar surface of the preformed planar structure. The capillary action of liquid solutions in small holes draws the bulk of the liquid flux material into the through holes 42, which are disposed in register with the solder balls, to effect successful solder bonding.

The selective application of flux to the solder balls has numerous advantages: there will be very little flux on the surfaces of the planar structure; a minimum amount of rosin is used to flux the solder balls; extra (waste) flux is kept out of the flip-chip assembly; and relative motion of the chips otherwise caused by the capillary action and/or surface tension of such excess molten flux will be minimized.

By successive dilution of the flux bath into which the planar structure is dipped, an optimal amount of flux can be empirically determined for particular applications that will both successfully flux the solder balls and minimize flux usage, and the aforementioned problems inherent therein.

Thus, the chips 32 are more easily and accurately held in place by mechanical means, such as with a chuck (not illustrated) during soldering, resulting in increased throughput (yield) of flip-chips in the manufacturing process. Further, the holes 42 in the planar structure 40 assist in maintaining registration of the solder balls 36 and corresponding solder balls 38, respectively, and hence alignment of the chips 32 with respect to the substrate 34.

Figure 4:
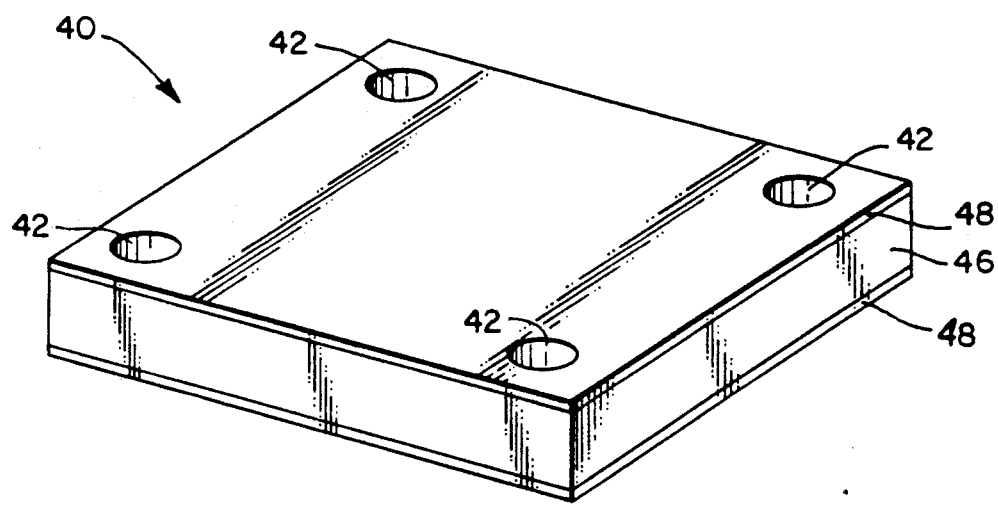
FIG. 4 is a perspective view of a plastic standoff element (preformed planar structure) employed in the technique of FIG. 3.

FIG. 4 shows, in further detail, the preformed planar structure 40 used in the inventive technique of FIG. 3. The planar structure 40 includes a planar core 46 formed of a material such as thermosetting organic resin or non-organic material (e.g. aluminum sheet, alumina sheet, beryllium oxide sheet). Laminated to both opposing faces of the core 46 are planar layers (faces) 48 formed of thermoplastic (resin) or thermosetting "skin" which can be expected to soften significantly at the elevated temperatures employed for solder reflow in the flip-chip bonding process. This softening and consequent shrinking of the thermoplastic resin skin (and hence shrinkage of the overall planar sturcture) will allow and encourage the chips to draw or grow closer to the substrate in response to surface tension caused by the molten solder balls and surface tension of the skin itself. This "growing together" of the chips and substrate, in other words diminution of the gap therebetween, is desirable to ensure that each and every solder ball has an opportunity to grow together and successfully fuse. Again, this enhances flip-chip throughput (yield) in the manufacturing process. It is also important to regulate the amount of growing together in that the requirements for solder ball shape may require a planar structure which does not generate a structure of minimum surface area.

The thermoplastic faces 48 will resolidify after soldering (upon reduction in temperature) and create a cushion for the faces 32A ad 34A of the chips 32 and substrate 34, respectively. Simultaneously, the shrinkage of the planar structure 40, especially the thermoplastic faces 48 thereof, will have the effect of drawing the chips together as they cool off to room temperature after soldering. In this manner, the solder balls are mechanically kept in contact with the chips and substrate, respectively, as well as with each other.

The core 46 of the preformed planar structure exhibits good thermal conductivity, and is formed of a rigid thermosetting organic resin or non-orgaic material, such as polyimide, polished alumina, polished sapphire, beryllium oxide, aluminum or aluminum nitride. A suitable polyimide is available from CIBA-CEIGY Corporation, Santa Clara, Calif. in their Probimide TM 300 or 400 Series, or Selectilux TM HTR 3, microelectronic materials. The faces 48 of the preformed planar structure 40 are formed of a thermoplastic material such as polyacetal, epoxies or polystyrene. It is advantageous that the preformed planar structure exhibit hermeticity and that it does not wick the liquid flux. The overall thickness of the preformed planar structure 40 is on the order of 5-50 microns, preferably 30—30 microns, and the preformed planar structure acts as a physical barrier standoff between the chip and the substrate.

A synergistic effect results from the use of the preformed planar structure which effectively eliminates flux from the faces of the chips and substrate by selectively causing the flux to be deposited on the solder balls and corresponding solder balls, respectively. Inasmuch as the faces of the chips and substrates are relatively clean, any adhesion of the planar structure (notably the "skin") thereto effects a mechanical connection of the solder balls and corresponding solder balls irrespective of soldering. (Albeit; the adhesion and shrinkage become effective at the elevated temperature experienced during soldering). This satisfies the adage that, "good mechanical joints lead to good solder joint".

The preformed planar structure 40 serves as a plastic standoff element to determine the size of the gap between the chips and the substrate. Evidently, the relatively solid core 46 of the planar structure 40 sets a relatively rigid lower limit on the amount that the chips can grow (draw) together to the substrate as the solder balls and corresponding solder balls melt and fuse together.

As mentioned hereinbefore, in prior art flip-chip manufacturing techniques the mechanical properties of the solder joints remain somewhat indeterminate. By use of the planar structure 40 in the manufacturing process, flip-chip structures can be formed without the usual concerns about solder ball bond rigidity. Evidently, the through holes 42 form a generally cylindrical "mold" of predetermined dimension wherein the solder joints are formed. One may view the resulting solder joint formed therein by the solder balls and corresponding solder balls as a mechanical structure (not illusttrated) of predetermined dimension, and calculate the resulting mechanical properties thereof, such as rigidity (or elasticity), shear strength, tensile strength, bending moment, etc.

Figure 5:
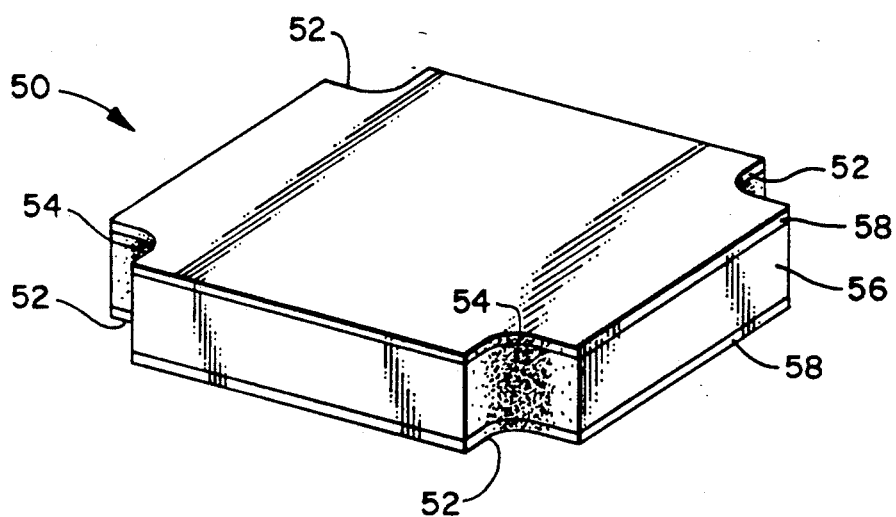
FIG. 5 is a perspective view of an alternate embodiment of a standoff element suitable to be employed in the technique of FIG. 3.

FIG. 5 is a perspective view of an alternate embodiment of a preformed planar structure, or standoff element 50, suitable to be employed in the technique of FIG. 3. With respect to the materials used to form the core 56 and faces 58, and the thickness thereof, the standoff element 50 is similar to the standoff element 40 shown in FIG. 4. However, rather than having through holes 42 in alignment with the solder balls 32 and corresponding solder balls 34, the standoff element 50 may be provided with corner cutouts 52 in alignment with the solder balls 32 and corresponding solder balls 34, and is sufficiently sized so that the solder joints are formed just outside its perimeter. The surfaces of the corner cutouts 52 can be left relatively rough (as compared with the faces 58) in order that liquid flux 54 tends to adhere thereto (as opposed to draining off the faces 58). As discussed with respect to the planar structure 40, the liquid flux is applied to the planar structure 50 by dipping the planar structure in a bath of liquid flux which is allowed to dry thereon. Under the elevated temperatures employed for solder bonding, the flux will be delivered to the solder balls 32 and to the corresponding solder balls 34.

The advantages of the standoff element 50 are similar to those of the standoff element 40 with respect to forming a gap of predetermined dimension between the chip and the substrate, aiding in drawing together the chip and the substrate, mechanically drawing together the solder balls and the corresponding solder balls, requiring less flux to effect soldering and, to a lesser extent aiding in maintaining alignment of the chip and the substrate and alleviating the usual concerns about solder ball bond rigidity.

The preformed planar (layered) structure cushions and draws and holds (upon resolidifying) the chip and the substrate together in the flip-chip manufacturing process. This improves the mechanical integrity of the flip-chip assembly and increased the resistance thereof to loss of electrical contact between the solder balls. This is important in that the solder balls themselves serve as the mechanical point of attachment between the chip and the substrate. Chip (to substrate) draw together is controlled, and a permanent tension is created between the chip and substrate.

The invention solves the problem of using too much flux and having the position of the chips change during bonding (soldering). The invention allows the use of an absolute minimum of flux so subsequent cleaning of the flip-chip assembly is simplified.

What is claimed is:

1. A flip-chip structure comprising:
   a chip having first solder balls on a face thereof;
   a substrate having corresponding second solder balls on a face thereof; and
   a separate and distinct preformed planar structure disposed between the chip and the substrate, having a periphery and two opposite faces, one face in contact with the chip and the opposite face in contact with the substrate;
   cutouts in the periphery of the preformed planar structure, extending from the one face to the opposite face; and
   solder joints consisting essentially of the first solder balls and corresponding second solder balls fused to one another within the cutouts;
   wherein
   the cutouts are sized to establish a predetermined mechanical structure of the solder joints formed by the first solder balls and the second corresponding solder balls.

2. A flip-chip structure according to claim 1, wherein the preformed planar structure has a planar core with two opposing faces and layers of material formed on the two opposing faces of the planar core.

3. A flip-chip structure according to claim 2, wherein the layers of material function as means for drawing the chip together to the substrate when the chip and the substrate are subjected to elevated temperatures for effecting soldering of the first solder balls to the corresponding second solder balls.

4. A flip-chip structure according to claim 2, wherein the core is formed of thermosetting organic resin.

5. A flip-chip structure according to claim 2, wherein the core is formed of non-organic material.

6. A flip-chip structure according to claim 2, wherein the core is formed of polymide.

7. A flip-chip structure according to claim 2, wherein the core is formed of polished alumina.

8. A flip-chip structure according to claim 2, wherein the core is formed of polished sapphire.

9. A flip-chip structure according to claim 2, wherein the core is formed of beryllium oxide.

10. A flip-chip structure according to claim 2, wherein the core is formed of aluminum nitride.

11. A flip-chip structure according to claim 2, wherein the core is formed of aluminum.

12. A flip-chip structure according to claim 2, wherein the layers are formed of thermosetting material.

13. A flip-chip structure according to claim 2, wherein the layers are formed of thermoplastic resin.

14. A flip-chip structure according to claim 2, wherein the layers are formed of polyacetal.

15. A flip-chip structure according to claim 2, wherein the layers are formed of epoxide resin.

16. A flip-chip structure according to claim 2, wherein the layers are formed of polystyrene.

17. A flip-chip structure according to claim 1, wherein the preformed planar structure has a thickness establishing a predetermined gap between the chip and the substrate.

18. A flip-chip structure according to claim 17, wherein the thickness of the preformed planar structure is 5-50 microns.

19. A flip-chip structure according to claim 18, wherein the thickness of the preformed planar structure is 20-30 microns.

20. A flip-chip structure according to claim 1, further comprising:

flux disposed within the cutouts.

* * * * *